(12) United States Patent
Nakano et al.

(10) Patent No.: US 10,975,465 B2
(45) Date of Patent: Apr. 13, 2021

(54) METHOD OF FORMING INTERNAL STRESS CONTROL FILM

(71) Applicant: ULVAC, INC., Chigasaki (JP)

(72) Inventors: Katsuaki Nakano, Chigasaki (JP); Daisuke Hiramatsu, Chigasaki (JP); Yukinobu Numata, Chigasaki (JP)

(73) Assignee: ULVAC, INC., Chigasaki (JP)

( * ) Notice: Subject to any disclaimer, the term of this patent is extended or adjusted under 35 U.S.C. 154(b) by 155 days.

(21) Appl. No.: 16/071,532

(22) PCT Filed: Jan. 25, 2017

(86) PCT No.: PCT/JP2017/002484
§ 371 (c)(1),
(2) Date: Jul. 20, 2018

(87) PCT Pub. No.: WO2017/199468
PCT Pub. Date: Nov. 23, 2017

(65) Prior Publication Data
US 2019/0071767 A1    Mar. 7, 2019

(30) Foreign Application Priority Data

May 16, 2016 (JP) .............................. JP2016-098158

(51) Int. Cl.
*C23C 14/34* (2006.01)
*H01L 21/285* (2006.01)
(Continued)

(52) U.S. Cl.
CPC ........ *C23C 14/345* (2013.01); *C23C 14/0042* (2013.01); *C23C 14/0641* (2013.01);
(Continued)

(58) Field of Classification Search
CPC .............. C23C 14/345; C23C 14/0042; C23C 14/0641; C23C 14/3492
See application file for complete search history.

(56) References Cited

U.S. PATENT DOCUMENTS 5,643,422 A * 7/1997 Yamada .............. C23C 14/0036
204/192.15
5,972,178 A * 10/1999 Narasimhan ........ C23C 14/0641
204/192.17
(Continued)

FOREIGN PATENT DOCUMENTS

CN 104328384 2/2015
JP 08-288273 11/1996
(Continued)

OTHER PUBLICATIONS

Kattelus, H., et al., "Stress control of sputter-deposited Mo—N films for micromechanical applications". Microelectronic Engineering 60 (2002) 97-105.*
(Continued)

*Primary Examiner* — Bret P Chen
(74) *Attorney, Agent, or Firm* — Grossman, Tucker, Perreault & Pfleger, PLLC

(57) ABSTRACT

A method of forming an internal stress control film on one surface of an object to be processed by a sputtering method, includes selecting a pressure of a process gas at the time of forming the internal stress control film from a pressure region higher than a threshold value of 5 (Pa) so that stress of the object to be processed when a bias is applied to the object to be processed becomes larger stress on a tensile side and the internal stress control film has higher density, as compared with stress in a case in which a bias is not applied thereto.

8 Claims, 12 Drawing Sheets

(51) Int. Cl.
  *C23C 14/00* (2006.01)
  *H01L 21/768* (2006.01)
  *C23C 14/35* (2006.01)
  *H01L 21/3205* (2006.01)
  *C23C 14/06* (2006.01)
  *H01L 21/033* (2006.01)

(52) U.S. Cl.
  CPC .......... *C23C 14/3492* (2013.01); *C23C 14/35* (2013.01); *H01L 21/0337* (2013.01); *H01L 21/285* (2013.01); *H01L 21/3205* (2013.01); *H01L 21/768* (2013.01)

(56) References Cited

U.S. PATENT DOCUMENTS

| | | | |
|---|---|---|---|
| 6,444,099 B1 | 9/2002 | Sasaki et al. | |
| 7,727,882 B1* | 6/2010 | Wu | H01L 21/76813 438/627 |
| 8,482,375 B2 | 7/2013 | Felmetsger | H01C 7/006 338/308 |
| 2004/0007779 A1 | 1/2004 | Arbuthnot et al. | |
| 2007/0281200 A1* | 12/2007 | Tanaka | H01M 8/1009 429/413 |
| 2008/0067680 A1* | 3/2008 | Sakai | H01L 21/2855 257/751 |
| 2009/0242385 A1* | 10/2009 | Robison | H01J 37/3426 204/192.11 |
| 2009/0242392 A1* | 10/2009 | Laptev | C23C 14/352 204/298.08 |
| 2009/0246385 A1* | 10/2009 | Felmetsger | C23C 14/025 427/301 |
| 2010/0105204 A1* | 4/2010 | Lam | H01L 21/76844 438/653 |
| 2011/0198556 A1* | 8/2011 | Yamamoto | H01L 45/1658 257/4 |
| 2012/0196148 A1* | 8/2012 | Chang | C23C 14/345 428/623 |
| 2013/0186743 A1* | 7/2013 | Mizuno | H01J 37/3452 204/192.12 |
| 2014/0017906 A1* | 1/2014 | Fu | H01L 21/02186 438/785 |
| 2014/0167198 A1* | 6/2014 | Hoenk | H01L 31/02161 257/437 |
| 2015/0107769 A1 | 4/2015 | Nakano | |
| 2015/0228496 A1* | 8/2015 | Nakano | C23C 14/5806 438/785 |

FOREIGN PATENT DOCUMENTS

| | | |
|---|---|---|
| JP | 10-330938 | 12/1998 |
| JP | 2002-500704 | 1/2002 |
| JP | 2005-519198 | 6/2005 |
| JP | 2015-151575 | 8/2015 |
| KR | 1020080106423 | 12/2008 |
| TW | 389943 | 5/2000 |
| TW | 488012 | 5/2002 |
| WO | 03/074755 | 9/2003 |
| WO | 2013/190765 | 12/2013 |

OTHER PUBLICATIONS

Han, Dong-Hoon, et al., "Stress control of sputtered W film using W/WN multilayer". Thin Solid Films 547 (2013) 216-221.*

Inoue, S., et al., "Stress control of a-SiC films deposited by dual source dc magnetron sputtering". Vacuum 80 (2006) 744-747.*

Dong-ling, Li, et al., "Stress control of silicon nitride films deposited by plasma enhanced chemical vapor deposition". Optoelectronics Letters vol. 12 No. 4 Jul. 1, 2016, pp. 0285-0289.*

Office Action from related Taiwanese Application No. 106103228 dated Mar. 14, 2019. English translation of the Search Report attached.

International Search Report from corresponding PCT Application No. PCT/JP2017/002484 dated Mar. 28, 2017. English translation attached.

Office Action from related Chinese Application No. 201780005953.9 dated Sep. 10, 2019. English translation of the Search Report attached.

Office Action from related Korean Application No. 10-2018-7017953 dated Jul. 1, 2020. English translation attached.

* cited by examiner

METHOD OF FORMING INTERNAL STRESS CONTROL FILM

TECHNICAL FIELD

The present invention relates to a method of forming an internal stress control film in which a thin film having a desired film stress from a compressive side to a tensile side can be separately made while maintaining high film density.

This application claims priority from Japanese Patent Application No. 2016-98158 filed on May 16, 2016, the contents of which are incorporated herein by reference in their entirety.

BACKGROUND ART

In a process of laminating a plurality of thin films to fabricate various types of devices, internal stress (internal stress) is generated on the thin films depending on fabrication conditions such as a material of a thin film, a thickness of the thin film, or a pressure or temperature at the time of forming the thin film, or depending on relative conditions between the thin film and an object to be processed constituting an underlayer of the thin film. As such internal stress (hereinafter also referred to as film stress), there are compressive stress (compressive stress) in which atoms are compressed from a reference state and interatomic distances are stretched, and tensile stress (tensile stress) in which atoms are pulled from a reference state and interatomic distances shrink.

Conventionally, methods for reducing film stress in a thin film in which compressive stress is generated have been proposed (Patent Document 1, Patent Document 2). However, a technology for separately manufacturing a thin film having these two types of internal stresses (compressive stress and tensile stress) simply by changing fabrication conditions at the time of forming the thin film has not been realized.

PRIOR ART DOCUMENTS

Patent Documents

[Patent Document 1] PCT International Publication No. WO 2013/190765
[Patent Document 2] Japanese Unexamined Patent Application, First Publication No. 2015-151575

SUMMARY OF THE INVENTION

Problems to be Solved by the Invention

As a description of a specific case, in a process of manufacturing a semiconductor device, when an interlayer insulating film is dry-etched as an object to be processed in order to obtain a predetermined interconnection pattern, a hard mask that limits a range of the interlayer insulating film to be etched is used. For example, a titanium nitride (TiN) film is suitably used as the hard mask, but is required to have high density because resistance to etching is necessary. Further, when internal stress of the titanium nitride film is high, since deformation of the interconnection pattern may occur, it is said that low internal stress (a low absolute value) is desirable.

In recent years, due to diversification of device structures, an underlying film formed prior to fabricating a hard mask may have internal stress generated in various directions such as compressive stress or tensile stress. In such a case, it is necessary to reduce stress acting on the entire film including the hard mask (laminate of the underlying film and the hard mask). For example, in a case in which the underlying film formed prior to forming the hard mask has high compressive stress or the like, it is important to balance stress of the entire film by forming the hard mask made of a titanium nitride film having high stress on a tensile side (tensile stress). Therefore, for the stress of the titanium nitride film itself, in order to offset the stress generated before forming the hard mask, development of technologies for controlling stress from high compressive stress to high tensile stress (in a numerical value, approximately −2 GPa to approximately +2 GPa) has been anticipated.

However, when a high-density titanium nitride film is formed, the titanium nitride film usually has high stress on the compressive side (compressive stress). In this case, when the titanium nitride film is formed to have stress on the tensile side (tensile stress) by a simple method, it is known that film density decreases as shown in FIG. 11. In order to reduce stress on the compressive side, or to change stress on the tensile side to stress on the compressive side, and furthermore, to change stress on the compressive side to high stress on the tensile side while maintaining a high-density state of the titanium nitride film, it was necessary to employ a method unsuitable for mass production such as a method of applying heat to the film after the film is formed, a method of using a complicated system for suppressing incident energy of titanium nitride particles when forming the titanium nitride film, or the like, for example.

Means for Solving the Problems

The present inventors analyzed structures of titanium nitride films and investigated the generated film stresses.

FIGS. 12A to 12D are views showing a relationship between a structure of a titanium nitride film and film stress. FIG. 12A is a schematic view showing a cross section of the film, and represents a state in which tensile stress acting so that the film (titanium nitride film) contracts with respect to a substrate (object to be processed) is generated. FIG. 12B is an enlarged view showing FIG. 12A and represents a state in which the titanium nitride film has a columnar structure and there are gaps between adjacent columnar structures. FIG. 12C is a scanning transmission electron microscope (STEM) image showing a cross section of the titanium nitride film, and from this image, the state shown in FIG. 12B was confirmed.

Therefore, the present inventors thought that it may be possible to separately manufacture thin films having desired film stresses from the compressive side to the tensile side if the adjacent columnar structures can be brought into close contact with each other and the gaps can be reduced as shown in FIG. 12D while maintaining high film density and developed the invention.

The invention has been devised in consideration of such conventional circumstances, and it is an object of the invention to provide a method of manufacturing an internal stress control film which can have large stress on the tensile side and high density simply by changing fabrication conditions at the time of forming the thin film.

A method of forming an internal stress control film on one surface of an object to be processed by a sputtering method, according to a first aspect of the invention, includes selecting a pressure of a process gas at the time of forming the internal stress control film from a pressure region higher than a threshold value of 5 (Pa) so that stress of the object to be processed when a bias is applied to the object to be processed becomes larger stress on a tensile side and the internal stress control film has higher density, as compared with stress in a case in which a bias is not applied thereto.

In the method of forming an internal stress control film according to the first aspect of the invention, stress before the bias is applied is tensile stress.

A method of forming an internal stress control film on one surface of an object to be processed by a sputtering method, according to a second aspect of the invention, includes: causing a bias BS applied to the object to be processed to be larger than zero; causing a power density of the bias BS to be in a range of $\frac{1}{150}$ or less of a power density of a bias BT applied to a target; and selecting a pressure of a process gas at the time of forming the internal stress control film from a pressure region higher than a threshold value of 5 (Pa).

A method of forming an internal stress control film on one surface of an object to be processed by a sputtering method, according to a third aspect of the invention, includes selecting a pressure of a process gas at the time of forming the internal stress control film from a pressure region higher than a threshold value of 5 (Pa) wherein the internal stress control film is made of titanium nitride; using a target made of titanium, and using a nitrogen-containing gas as the process gas; and in a graph G1 in which a horizontal axis is a pressure P of the process gas and a vertical axis is a ratio R1 (=BS/BT) which is a numerical value obtained by dividing a bias BS applied to the object to be processed by a bias BT applied to the target, selecting a combination of the pressure P and the ratio R1 from the graph so as to be included in an upper right region of a curve α passing through three points a1 (10.0, 0.0016), a2 (17.0, 0.00059), and a3 (25.0, 0.0001).

In the method of forming an internal stress control film according to the third aspect of the invention, a combination of the pressure P and the ratio R1 is selected from the graph G1 so as to be included in an upper right region of a curve β passing through three points b1 (10.0, 0.00241), b2 (17.0, 0.0012), and b3 (25.0, 0.0004).

A method of forming an internal stress control film on one surface of an object to be processed by a sputtering method, according to a fourth aspect of the invention, includes selecting a pressure of a process gas at the time of forming the internal stress control film from a pressure region higher than a threshold value of 5 (Pa) wherein the internal stress control film is made of titanium nitride; using a target made of titanium, and using a nitrogen-containing gas as the process gas; and in a graph G2 in which a horizontal axis is a pressure P of the process gas and a vertical axis is a ratio R2 which is a numerical value of a bias BS applied to the object to be processed with respect to a film deposition rate of 10 nm/min of the internal stress control film, selecting a combination of the pressure P and the ratio R2 from the graph so as to be included in an upper right region of a curve γ passing through three points c1 (10.0, 0.0032), c2 (17.0, 0.0018), and c3 (25.0, 0.0008).

In the method of forming an internal stress control film according to the fourth aspect of the invention, a combination of the pressure P and the ratio R2 is selected from the graph G2 so as to be included in an upper right region of a curve δ passing through three points d1 (10.0, 0.008), d2 (17.0, 0.0034), and d3 (25.0, 0.002).

In the method of forming an internal stress control film according to the first to fourth aspect of the invention, a nitrogen-containing gas forming the process gas is composed of argon gas and nitrogen gas, and a flow rate ratio occupied by the nitrogen gas in the nitrogen-containing gas is 50(%) or more.

In the method of forming an internal stress control film according to the first to fourth aspects of the invention, a nitrogen-containing gas forming the process gas is composed of argon gas and nitrogen gas, and a flow rate ratio occupied by the nitrogen gas in the nitrogen-containing gas is 70(%) or more.

Effects of the Invention

In the method of forming an internal stress control film according to the above-described aspects of the invention, a weak bias BS is applied to the object to be processed when the internal stress control film is formed on one surface of the object to be processed by a sputtering method. The internal stress control film is formed on the object to be processed in a state in which the bias BS is applied. At that time, a strong tensile stress film can be obtained by applying a weak bias while a pressure of the process gas (a pressure at the time of forming the thin film, a discharge pressure) is set to a threshold value of 5 (Pa) or more. Further, by increasing the value of the bias being applied, it is possible to change the stress from the tensile side to the compressive side while maintaining high film density.

Also, in the graph G1 in which a horizontal axis is the pressure P of the process gas and a vertical axis is the ratio R1 (=BS/BT) which is a numerical value obtained by dividing the bias BS applied to the object to be processed by the bias BT applied to the target, or in the graph G2 in which a horizontal axis is the pressure P of the process gas and a vertical axis is the ratio R2 which is a numerical value of the bias BS applied to the object to be processed with respect to a film deposition rate of 10 nm/min of the internal stress control film, when the titanium nitride film is formed to satisfy specific indices, the titanium nitride film having a film density of 4.6 (g/cm$^3$) or more, or 5.0 (g/cm$^3$) or more, and having film stress on the tensile (tensile) side as film stress can be stably manufactured.

DETAILED DESCRIPTION

Hereinafter, one embodiment of a method of manufacturing an internal stress control film according to the invention will be described with reference to the drawings. In the present embodiment, a case in which a substrate W constituting an object to be processed is a silicon wafer and titanium nitride is formed as an internal stress control film on the substrate W will be described in detail.

Figure 1:
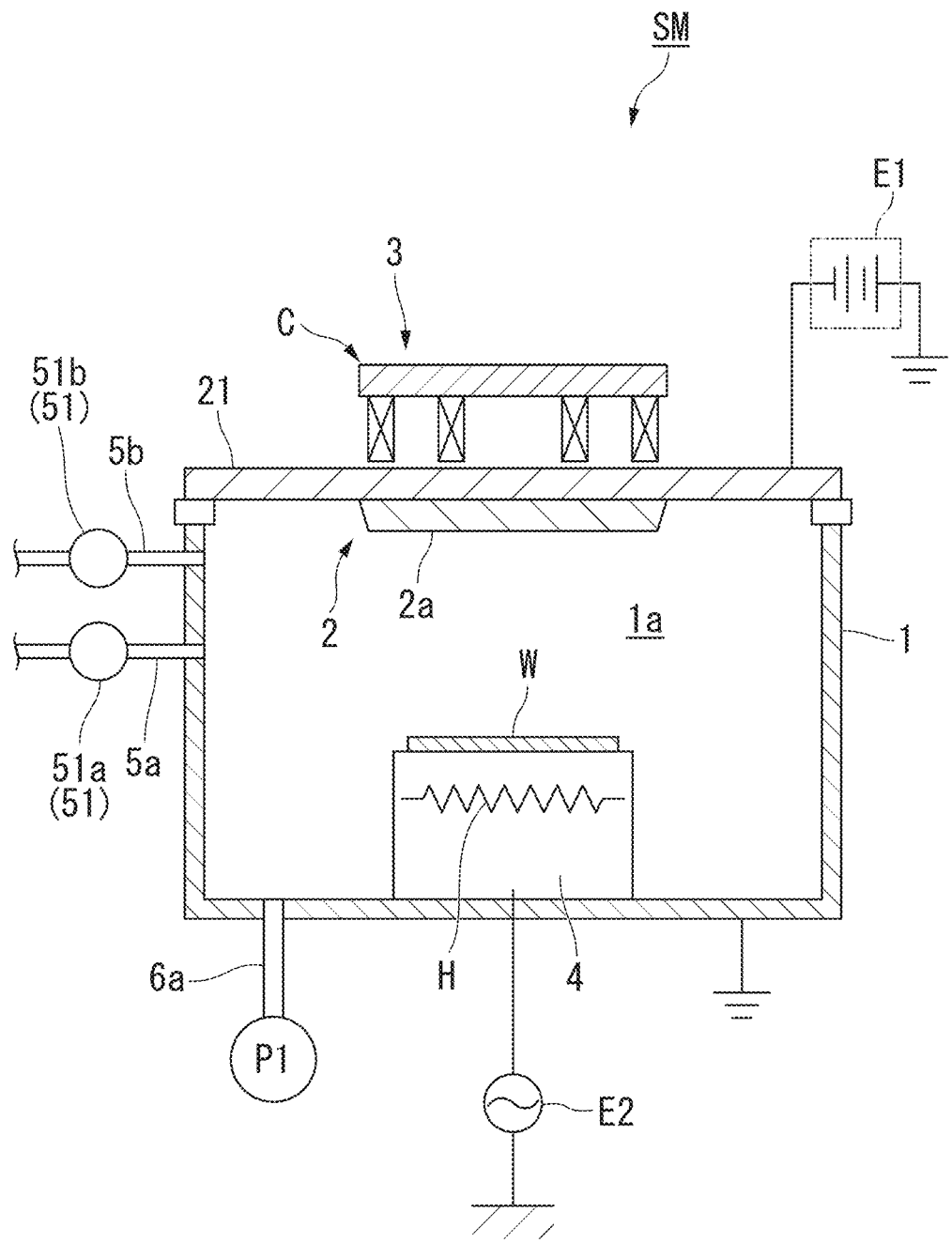
FIG. 1 is a schematic configuration view showing an example of a manufacturing apparatus used for a method of manufacturing an internal stress control film.

FIG. 1 is a schematic configuration view showing an example of a sputtering apparatus SM that can implement a method of manufacturing an internal stress control film according to one embodiment of the invention. The sputtering apparatus SM is a magnetron type sputtering apparatus and includes a vacuum chamber 1 in which a vacuum processing chamber 1a is defined. A cathode C is attached to a ceiling portion of the vacuum chamber 1. In the following description, in FIG. 1, a direction toward the ceiling portion of the vacuum chamber 1 will be described as "up," and a direction toward a bottom portion of the vacuum chamber 1 will be described as "down."

The cathode C is constituted by a target 2 which is a base material of the internal stress control film and a magnet 3 disposed above the target 2. The target 2 is made of titanium (for example, a target including titanium and inevitable elements), and is formed in a circular shape in plan view by a known method according to a contour of the substrate W constituting the object to be processed.

On an upper surface of the target 2 (a surface opposite to a sputtering surface 2a), a backing plate 21 for cooling the target 2 during film formation by sputtering is mounted, and is attached to the vacuum chamber 1 with an insulator (not shown) interposed therebetween such that the sputtering surface 2a is positioned on a lower side thereof.

An output from a sputtering power supply E1 such as a direct current (DC) power supply is connected to the target 2, and is configured such that DC power (30 kW or less) having a negative potential is applied to the target 2 at the time of forming a thin film. The magnet 3 disposed above the target 2 generates a magnetic field in a space below the sputtering surface 2a of the target 2. The magnet 3 has a known structure for supplementing electrons and the like ionized below the sputtering surface 2a so that sputtered particles scattered from the target 2 are effectively ionized at the time of sputtering. Detailed description of the magnet 3 will be omitted.

At a bottom portion of the vacuum chamber 1, a stage 4 is disposed to face the sputtering surface 2a of the target 2. The substrate W placed on the stage 4 is positioned and held so that a film formation surface of the substrate W faces upward. In the present embodiment, a distance between the target 2 and the substrate W may be set to 20 to 800 mm, preferably 40 to 450 mm, and more preferably 40 to 100 mm, in consideration of productivity, the number of times scattering is performed, or the like.

In addition, an output from a bias power supply E2 such as a radio frequency (RF) power supply is connected to the stage 4, and is configured such that alternating current (AC) power can be applied to the substrate W at the time of forming a thin film. Further, the stage 4 includes a temperature control device H (temperature control means) embedded therein and is configured to control a temperature of the substrate W as necessary at the time of forming a thin film.

A first gas pipe 5a for introducing a sputtering gas which is a rare gas such as argon and a second gas pipe 5b for introducing a nitrogen-containing gas are connected to a side wall of the vacuum chamber 1. Mass flow controllers 51a and 51b are respectively inserted in the first gas pipe 5a and the second gas pipe 5b to communicate with gas sources (not shown). Therefore, a flow-rate-controlled sputtering gas and a reactive gas are introduced into the vacuum processing chamber 1a evacuated at a constant evacuation rate by a vacuum evacuation device (vacuum evacuation means) to be described below. Therefore, during film formation, a pressure (total pressure) of the vacuum processing chamber 1a is maintained substantially constant.

An evacuation pipe 6 communicating with the vacuum evacuation device (not shown) constituted by a desired pump is connected to the bottom portion of the vacuum chamber 1. Although not particularly shown, the sputtering apparatus SM includes a known control device (control means) having a microcomputer, a sequencer, and the like. The control device is configured to collectively manage an operation of the power supplies E1 and E2 described above, an operation of the mass flow controllers 51a and 51b described above, an operation of the vacuum evacuation device described above, and the like.

Hereinafter, a method of manufacturing the internal stress control film using the above-described sputtering apparatus SM will be specifically described.

First, the substrate W (for example, a silicon wafer) is placed on the stage 4 in the vacuum chamber 1 in which the target 2 made of titanium is mounted. The vacuum evacuation device is operated to evacuate the inside of the vacuum processing chamber 1a to a predetermined degree of vacuum (for example, $1\times10^{-5}$ Pa). After the inside of the vacuum processing chamber 1a reaches a predetermined pressure, the mass flow controllers 51a and 51b are controlled to introduce argon gas and nitrogen gas into the vacuum processing chamber 1a at a desired flow rate. Here, a gas obtained by adding nitrogen gas to argon gas is "a nitrogen-containing gas" in the invention. For example, the argon gas and the nitrogen gas are controlled at a desired flow rate so that the inside of the vacuum processing chamber 1a reaches a predetermined pressure (total pressure) in a range of 0.5 to 40 Pa. Here, the target made of titanium is a target containing titanium as a main component, and the fact that it is the main component means that a ratio by weight of titanium is 50% or more. Further, it is preferable to use a target made of titanium and inevitable impurities.

With the inside of the vacuum processing chamber 1a set at a predetermined pressure (total pressure), a DC power having a predetermined negative potential is applied to the target 2 from the sputtering power supply E1 to form a plasma atmosphere in the vacuum chamber 1. Therefore, a titanium nitride film is formed on a surface of the substrate W by reactive sputtering.

When the reactive sputtering described above is performed under a certain pressure condition, for example, by applying a weak bias of approximately 5 (W), a strong tensile stress film can be obtained. Further, by increasing a value of the applied bias, it is possible to change the stress from a tensile side to a compressive side while maintaining high film density.

In order to obtain the tensile stress film described above, it is important to satisfy conditions such that a bias BS applied to the object to be processed is larger than zero, power density of the bias BS is in a range of 1/150 or less of power density of a bias BT applied to the target, and a pressure of a process gas at the time of forming the internal stress control film is selected from a pressure region higher than a threshold value of 5 (Pa).

In other words, in the method of manufacturing an internal stress control film according to the embodiment of the invention, the film formation is performed in a film formation atmosphere in which the pressure is high and a large amount of nitrogen is present while applying the weak bias BS to a titanium nitride film grown in a columnar shape on the object to be processed. Therefore, according to the embodiment of the invention, films having desired film stress from the compressive (compressive) side to the tensile (tensile) side can be separately formed with respect to the object to be processed without causing sudden damage to a columnar structure of the titanium nitride film while maintaining high film density. Therefore, the invention provides a manufacturing method capable of forming a titanium nitride film that aims to have a required film stress while maintaining a state of high density.

According to the embodiment of the invention, when the internal stress control film is made of titanium nitride, films having high film density of 5.0 (g/cm$^3$) or more and having desired film stress from the compressive (compressive) side of approximately −2 GPa to the tensile (tensile) side of approximately +2 GPa can be separately manufactured.

In other words, in view of forming an internal stress control film having small film stress, film stress more on the tensile (tensile) side than the compressive (compressive) side at approximately −500 MPa or film stress more on the compressive (compressive) side than the tensile (tensile) side at approximately +500 MPa can be selected. In addition, film stress more on the tensile (tensile) side than the compressive (compressive) side at approximately −100 MPa or film stress more on the compressive (compressive) side than the tensile (tensile) side at approximately +100 MPa can also be selected. Alternatively, when an underlying film formed prior to formation of the internal stress control film has high stress or the like, in order to be balanced as the entire film by canceling out stress, film stress of the internal stress control film can be selected between the compressive (compressive) side of approximately −2 GPa and the tensile (tensile) side of approximately +2 GPa.

Particularly, when a pressure of the process gas at the time of forming the internal stress control film is selected from a pressure region higher than the threshold value of 5 (Pa), it is possible to form the internal stress control film having film stress on the tensile side while maintaining the high film density of 5.0 (g/cm$^3$) or more according to the embodiment of the invention.

Next, a case in which the internal stress control film is made of titanium nitride will be described more specifically. In a graph G1 shown in FIG. 8, a target made of titanium and a nitrogen-containing gas are used, a pressure P of the process gas is shown on the horizontal axis, and a ratio R1 (=BS/BT) which is a numerical value obtained by dividing the bias BS applied to the object to be processed by the bias BT applied to the target is shown on the vertical axis. An internal stress control film having a high film density of 4.6 (g/cm$^3$) or more and having film stress on the tensile (tensile) side can be formed by selecting a combination of the pressure P and the ratio R1 from the graph so as to be included in an upper right region of a curve α passing through three points a1 (10.0, 0.0016), a2 (17.0, 0.00059), and a3 (25.0, 0.0001).

Here, "three points a1 (10.0, 0.0016), a2 (17.0, 0.00059), and a3 (25.0, 0.0001)" are also called specific indices.

Among them, by selecting a combination of the pressure P and the ratio R1 from the graph so as to be included in an upper right region of a curve β passing through three points b1 (10.0, 0.00241), b2 (17.0, 0.0012), and b3 (25.0, 0.0004) in the graph G1, the film density is further increased and a titanium nitride film having film density of 5.0 (g/cm$^3$) or more can be stably fabricated.

Here, "three points b1 (10.0, 0.00241), b2 (17.0, 0.0012), and b3 (25.0, 0.0004)" are also called specific indices.

In addition, a case in which the internal stress control film is made of titanium nitride will be described more specifically. In a graph G2 shown in FIG. 9, a target made of titanium and a nitrogen-containing gas are used, the pressure P of the process gas is shown on the horizontal axis, and a ratio R2 (=DR/BS) which is a numerical value obtained by dividing a film deposition rate DR of the internal stress control film by the bias BS applied to the object to be processed is shown on the vertical axis. An internal stress control film having high film density of 4.6 (g/cm$^3$) or more and having film stress on the tensile (tensile) side can be formed by selecting a combination of the pressure P and the ratio R2 from the graph G2 so as to be included in an upper right region of a curve γ passing through three points, c1 (10.0, 0.0032), c2 (17.0, 0.0018), and c3 (25.0, 0.0008).

Here, "three points, c1 (10.0, 0.0032), c2 (17.0, 0.0018), and c3 (25.0, 0.0008)" are also called specific indices.

Among them, by selecting a combination of the pressure P and the ratio R2 from the graph G2 so as to be included in an upper right region of a curve δ passing through three points d1 (10.0, 0.008), d2 (17.0, 0.0034), and d3 (25.0, 0.002), the film density is further increased and a titanium nitride film having film density of 5.0 (g/cm$^3$) or more can be stably fabricated.

Here, "three points d1 (10.0, 0.008), d2 (17.0, 0.0034), and d3 (25.0, 0.002)" are also called specific indices.

In the method of forming an internal stress control film according to the embodiment of the invention, a combination of argon gas and nitrogen gas is appropriately used as the nitrogen-containing gas. By setting the flow rate ratio occupied by the nitrogen gas in the nitrogen-containing gas to 50(%) or more, it is possible to cause the inside of the vacuum processing chamber 1a in which the internal stress control film is formed to be a film formation atmosphere in which the pressure is high and a large amount of nitrogen is present.

Therefore, combinations of fabrication conditions shown in graphs G1 and G2 described above can be obtained.

When the flow rate ratio occupied by the nitrogen gas in the nitrogen-containing gas is set to 70% or more, the inside of the vacuum processing chamber 1a can be in a film formation atmosphere in which a larger amount of nitrogen is present. Therefore, a larger stress on the tensile side can be obtained, which is more preferable. In addition, in forming the internal stress control film having film stress on the tensile side while having high film density, a pressure of the process gas at the time of forming the internal stress control film is preferably selected from a pressure region higher than 5 (Pa) or more.

Example 1

In the present example, the sputtering apparatus SM of FIG. 1 was used, and a pressure (discharge pressure) at the time of forming a thin film on an object to be processed (the substrate W made of a silicon wafer) was changed between 0.35 and 25 Pa to form a titanium nitride film (thickness: 20 nm). At that time, a bias BS dependence property was investigated by changing the bias BS applied to the substrate W (3 conditions: 0 W, 5 W, and 50 W). The result is shown in FIG. 2, which is a graph showing a relationship between a pressure (discharge pressure) and film stress at the time of forming a thin film.

Figure 2:
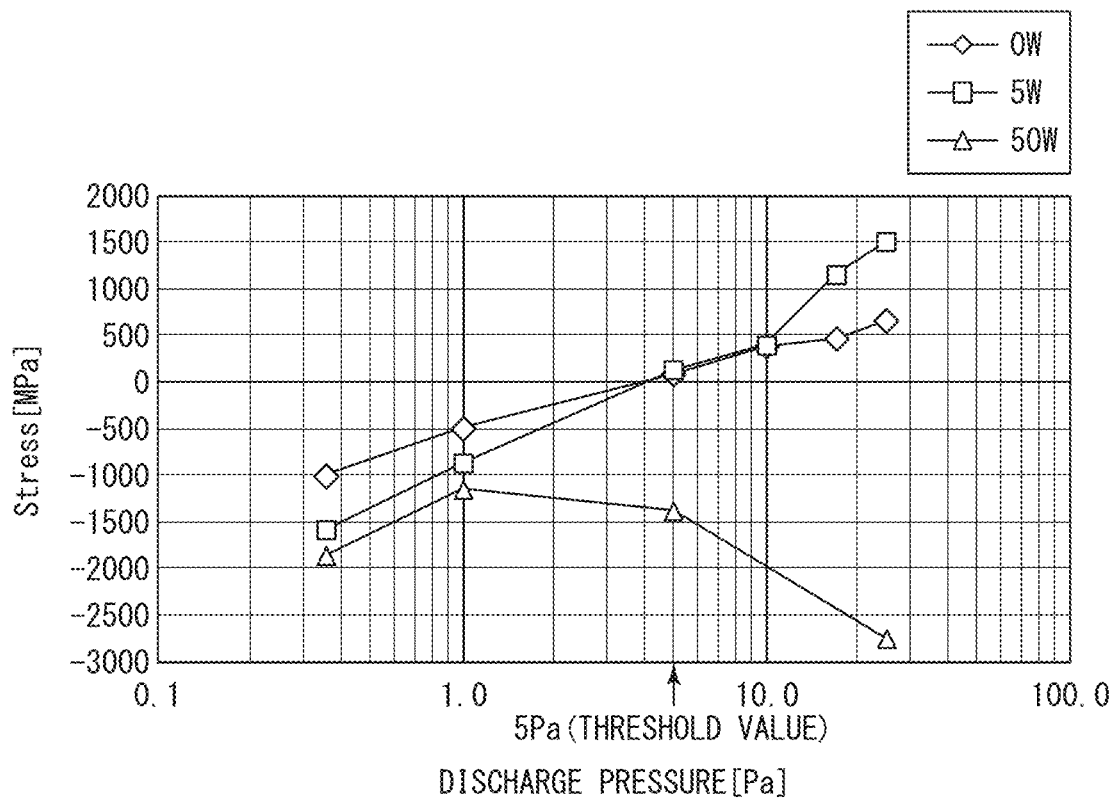
FIG. 2 is a graph showing a relationship between a pressure and film stress at the time of forming a thin film.

From FIG. 2, the following points became clear.

(A1) When the bias BS was 50 W, the fabricated titanium nitride film was not dependent on the discharge pressure and had film stress on the compressive (compressive) side with respect to the object to be processed. When the discharge pressure was more than 1 Pa, the film stress on the compressive (compressive) side showed an increasing tendency, and a maximum film stress (approximately −2800 (MPa)) was observed at the discharge pressure of 25 Pa. Film density was approximately 5.65 (g/cm$^3$) (see FIG. 4 in a subsequent stage).

(A2) When the bias BS was not applied (0 W), in accordance with an increase in the discharge pressure, it was found that the film stress changed from film stress on the compressive (compressive) side to film stress on the tensile (tensile) side with respect to the object to be processed. A change from the compressive to the tensile occurred at the threshold value of approximately 5 Pa. The film stress (MPa) in this case can be changed in a range of −1000 to +600. Film density was approximately 4.15 (g/cm$^3$) (see FIG. 4 in a subsequent stage).

(A3) When the bias BS was weakly applied (5 W), it was found that the film stress was changed rapidly from film stress on the compressive (compressive) side to film stress on the tensile (tensile) side with respect to the object to be processed in accordance with an increase in the discharge pressure. Also in this case, a change from the compressive to the tensile occurred at the threshold value of approximately 5 Pa as in the case in which the bias BS was not applied. The film stress (MPa) in this case can be changed in a range of −1600 to +1500. Film density was approximately 5.35 (g/cm$^3$) (see FIG. 4 in a subsequent stage).

Figure 3A:
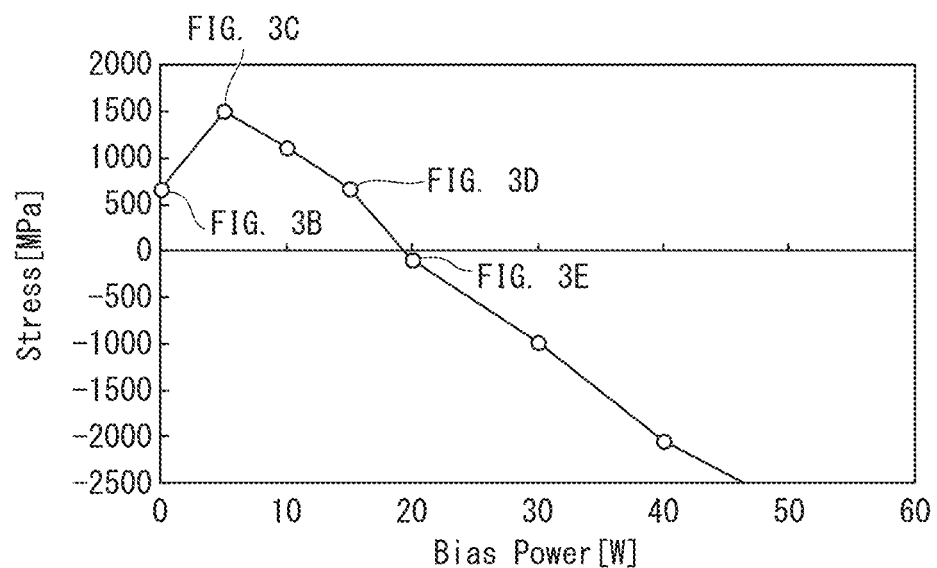
FIG. 3A is a graph showing a relationship between a bias applied to an object to be processed and film stress.
Figure 3B:
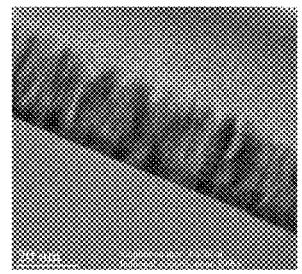
FIG. 3B is a view showing a cross section of the object to be processed, and is an image obtained by imaging using a scanning transmission electron microscope (STEM).
Figure 3C:
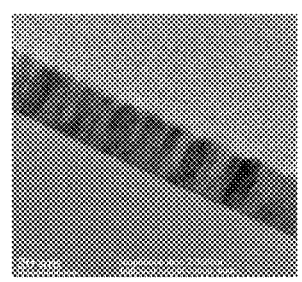
FIG. 3C is a view showing a cross section of the object to be processed and is an image obtained by imaging using the STEM.
Figure 3D:
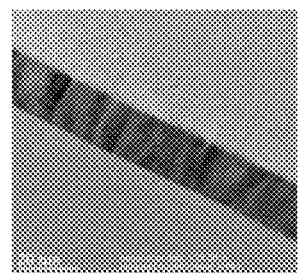
FIG. 3D is a view showing a cross section of the object to be processed and is an image obtained by imaging using the STEM.
Figure 3E:
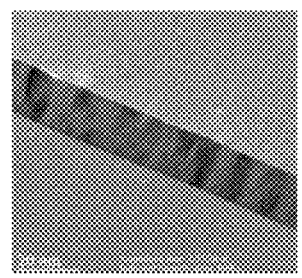
FIG. 3E is a view showing a cross section of the object to be processed and is an image obtained by imaging using the STEM.

FIG. 3A is a graph showing a relationship between the bias BS applied to the object to be processed and the film stress. FIGS. 3B to 3E are scanning transmission electron microscope (STEM) images showing cross sections. FIGS. 3B to 3E show cases in which the bias BS was 0 W, 5 W, 15 W, and 20 W, respectively.

Figure 4A:
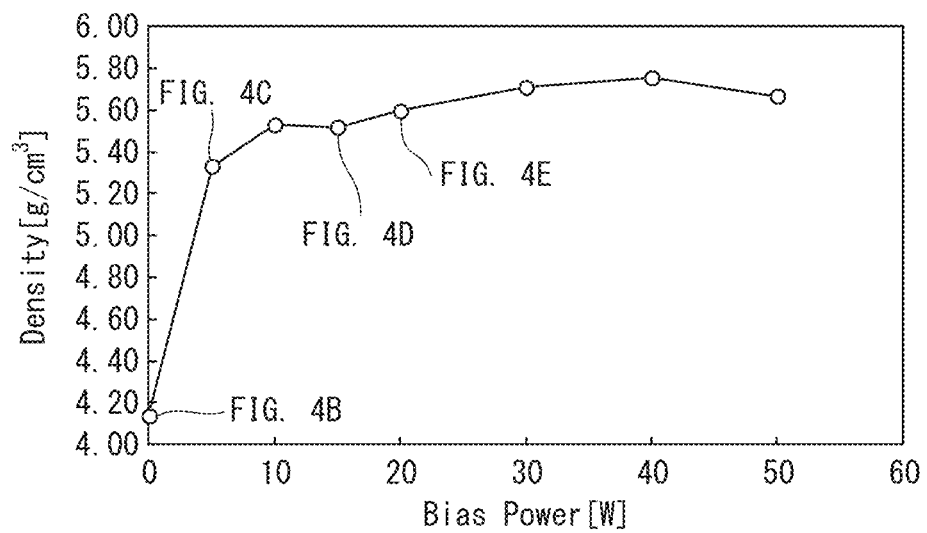
FIG. 4A is a graph showing a relationship between a bias applied to an object to be processed and film density.
Figure 4B:
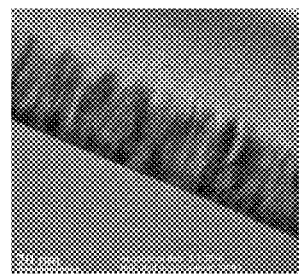
FIG. 4B is a view showing a cross section of the object to be processed, and is an image obtained by imaging using a STEM.
Figure 4C:
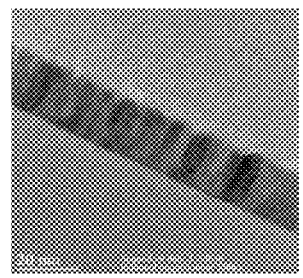
FIG. 4C is a view showing a cross section of the object to be processed and is an image obtained by imaging using the STEM.
Figure 4D:
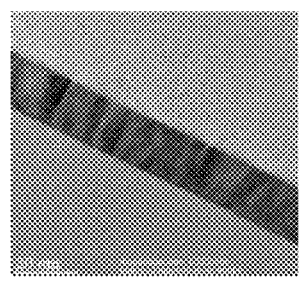
FIG. 4D is a view showing a cross section of the object to be processed and is an image obtained by imaging using the STEM.
Figure 4E:
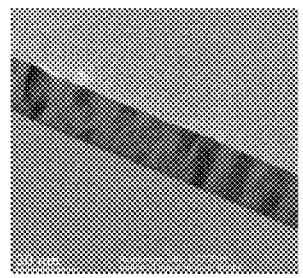
FIG. 4E is a view showing a cross section of the object to be processed and is an image obtained by imaging using the STEM.

FIG. 4A is a graph showing a relationship between the bias power applied to the object to be processed and film density. FIGS. 4B to 4E are STEM images showing cross sections. FIGS. 4B to 4E show cases in which the bias BS was 0 W, 5 W, 15 W, and 20 W, respectively.

From FIGS. 3 and 4, the following points became clear.

(B1) As the bias BS increased from 0 W to 5 W, the film stress showed an increasing tendency on the tensile (tensile) side (from 600 to +1500 (MPa)). At that time, the film density rapidly increased (from 4.15 to 5.35 (g/cm$^3$)).

(B2) When the bias BS was more than 5 W, the film stress showed a monotonic decreasing tendency. The film stress changed from film stress on the tensile (tensile) side to film stress on the compressive (compressive) side with the bias BS approximately 20 W as a threshold value.

(B3) When the bias BS was more than 5 W, the film density was stabilized in a range of 5.50 to 5.75 (g/cm$^3$). From the cross-sectional SEM images, it was presumed that, as a magnitude of the bias BS applied at the time of forming a thin film increased, spaced portions in a columnar structure were narrowed, the spaced portions were closed and changed to a dense structure, and thereby a titanium nitride film having large film density was obtained. In addition, since the stress was greatly changed in a state in which there was almost no change in density, it can be presumed that stress characteristics of the film itself changed in these regions.

In addition, roughness (an arithmetic average roughness Ra) of a film surface was measured using an atomic force microscope (AFM). As a result, roughness of the film surface fabricated under a condition of high pressure only (when the bias BS was 0 W) was 0.94 nm. On the other hand, roughness of the film surface fabricated under conditions of high pressure and weak bias (when the bias BS was 5 W) was 0.26 nm. The evaluation result on the roughness of the film surface supports the above-described presumption (spaced portions of the columnar structure were narrowed, and the spaced portions were closed and changed to a dense structure).

Example 2

In the present example, film stress and film density under four pressure conditions (10.0, 17.0, 25.0, and 37.0 (Pa)) were investigated for a titanium nitride film. At that time, DC power (having a negative potential) applied to the target 2 was changed up to a maximum of five conditions (3.5, 7, 10.5, 14, 17.5, and 21 (kW)). In addition, the bias BS applied to the object to be processed was changed up to a maximum of 8 conditions (0, 2, 5, 10, 15, 20, 25, and 30 (W)).

Tables 1 to 3 are cases in which the pressure P of the process gas is 10.0 (Pa), among which Table 1 represents film stress, Table 2 represents film density, and Table 3 represents film deposition rates.

Tables 4 to 6 are cases in which the pressure P of the process gas is 17.0 (Pa), among which Table 4 represents film stress, Table 5 represents film density, and Table 6 represents film deposition rates.

Tables 7 to 9 are cases in which the pressure P of the process gas is 25.0 (Pa), among which Table 7 represents film stress, Table 8 represents film density, and Table 9 represents film deposition rates.

Tables 10 to 12 are cases in which the pressure P of the process gas is 37.0 (Pa), among which Table 10 represents film stress, Table 11 represents film density, and Table 12 represents film deposition rates.

In each table, for example, a description of "7.6E-03" means "$7.6 \times 10^{-3}$."

A symbol "--" means that there is no corresponding data.

TABLE 1

| 0/800: 10 Pa | | Film stress [MPa] | | | | |
|---|---|---|---|---|---|---|
| Stress DC | Bias | 0 W 0 | 2 W 3.0E−03 | 5 W 7.6E−03 | 10 W 1.5E−02 | 15 W 2.3E−02 |
| 3.5 kW | 2.3E+00 | — | 533 | 662 | 799 | — |
| 7 kW | 4.6E+00 | 389 | — | 401 | 481 | 397 |
| 10.5 kW | 6.9E+00 | — | — | 151 | 242 | 321 |
| 14 kW | 9.2E+00 | — | — | 255 | 220 | 254 |
| 17.5 kW | 1.2E+01 | — | — | — | — | — |
| 21 kW | 1.4E+01 | — | — | — | — | — |

TABLE 2

| 0/800: 10 Pa | | Film density [g/cm$^3$] | | | | |
|---|---|---|---|---|---|---|
| Stress DC | Bias | 0 W 0 | 2 W 3.0E−03 | 5 W 7.6E−03 | 10 W 1.5E−02 | 15 W 2.3E−02 |
| 3.5 kW | 2.3E+00 | — | 4.6 | 5.0 | 5.3 | — |
| 7 kW | 4.6E+00 | 4.1 | — | 4.6 | 5.1 | 5.2 |
| 10.5 kW | 6.9E+00 | — | — | 4.4 | 4.7 | 4.8 |
| 14 kW | 9.2E+00 | — | — | 4.4 | 4.6 | 4.7 |
| 17.5 kW | 1.2E+01 | — | — | — | — | — |
| 21 kW | 1.4E+01 | — | — | — | — | — |

TABLE 3

| 0/800: 10 Pa | | Film deposition rate [nm/min] | | | | |
|---|---|---|---|---|---|---|
| Stress DC | Bias | 0 W 0 | 2 W 3.0E−03 | 5 W 7.6E−03 | 10 W 1.5E−02 | 15 W 2.3E−02 |
| 3.5 kW | 2.3E+00 | — | 6.0 | 6.1 | 6.0 | — |
| 7 kW | 4.6E+00 | 16.1 | — | 16.0 | 15.6 | 15.7 |
| 10.5 kW | 6.9E+00 | — | — | 28.5 | 28.6 | 28.1 |
| 14 kW | 9.2E+00 | — | — | 42.1 | 42.3 | 42.4 |
| 17.5 kW | 1.2E+01 | — | — | — | — | — |
| 21 kW | 1.4E+01 | — | — | — | — | — |

TABLE 4

| 0/1000: 17.0 Pa | | Film stress [MPa] | | | | | |
|---|---|---|---|---|---|---|---|
| Stress DC | Bias | 0 W 0 | 2 W 3.0E−03 | 5 W 7.6E−03 | 10 W 1.5E−02 | 15 W 2.3E−02 | 20 W 3.0E−02 |
| 3.5 kW | 2.3E+00 | — | — | — | — | — | — |
| 7 kW | 4.6E+00 | 472 | — | 1157 | 1044 | 641 | — |
| 10.5 kW | 6.9E+00 | 475 | 517 | 732 | 967 | 869 | — |
| 14 kW | 9.2E+00 | 315 | — | 597 | 704 | 789 | 704 |
| 17.5 kW | 1.2E+01 | — | — | — | 406 | 673 | 582 |
| 21 kW | 1.4E+01 | — | — | — | 351 | 432 | 462 |

TABLE 5

| 0/1000: 17.0 Pa | | Film density [g/cm³] | | | | | |
|---|---|---|---|---|---|---|---|
| Stress DC | Bias | 0 W 0 | 2 W 3.0E−03 | 5 W 7.6E−03 | 10 W 1.5E−02 | 15 W 2.3E−02 | 20 W 3.0E−02 |
| 3.5 kW | 2.3E+00 | — | — | — | — | — | — |
| 7 kW | 4.6E+00 | 4.4 | — | 5.2 | 5.7 | 5.5 | — |
| 10.5 kW | 6.9E+00 | 4.4 | 4.5 | 5.0 | 5.4 | 5.5 | — |
| 14 kW | 9.2E+00 | 4.0 | — | 4.7 | 5.1 | 5.2 | 5.4 |
| 17.5 kW | 1.2E+01 | — | — | — | 4.7 | 5.0 | 5.2 |
| 21 kW | 1.4E+01 | — | — | — | 4.6 | 4.8 | 4.9 |

TABLE 6

| 0/1000: 17.0 Pa | | Film deposition rate [nm/min] | | | | | |
|---|---|---|---|---|---|---|---|
| Stress DC | Bias | 0 W 0 | 2 W 3.0E−03 | 5 W 7.6E−03 | 10 W 1.5E−02 | 15 W 2.3E−02 | 20 W 3.0E−02 |
| 3.5 kW | 2.3E+00 | — | — | — | — | — | — |
| 7 kW | 4.6E+00 | 11.8 | — | 11.8 | 11.9 | 11.9 | — |
| 10.5 kW | 6.9E+00 | 21.4 | 21.2 | 21.1 | 21.2 | 21.2 | — |
| 14 kW | 9.2E+00 | 32.7 | — | 31.7 | 31.9 | 31.8 | 31.6 |
| 17.5 kW | 1.2E+01 | — | — | — | 43.6 | 44.0 | 44.2 |
| 21 kW | 1.4E+01 | — | — | — | 56.7 | 57.2 | 57.2 |

TABLE 7

| 0/1200: 25.0 Pa | | Film stress [MPa] | | | | | | | |
|---|---|---|---|---|---|---|---|---|---|
| Stress DC | Bias | 0 W 0 | 2 W 3.0E−03 | 5 W 7.6E−03 | 10 W 1.5E−02 | 15 W 2.3E−02 | 20 W 3.0E−02 | 25 W 3.8E−02 | 30 W 4.5E−02 |
| 3.5 kW | 2.3E+00 | — | — | — | — | — | — | — | — |
| 7 kW | 4.6E+00 | 507 | 1125 | 1511 | 1114 | 672 | −95 | — | −984 |
| 10.5 kW | 6.9E+00 | — | — | 1392 | 1326 | 940 | — | — | — |
| 14 kW | 9.2E+00 | — | — | 1021 | 1283 | 1206 | — | — | — |
| 17.5 kW | 1.2E+01 | — | — | — | 1036 | 1176 | 1031 | — | — |
| 21 kW | 1.4E+01 | — | — | — | 758 | 999 | 1047 | 886 | 680 |

TABLE 8

| 0/1200: 25.0 Pa | | Film density [g/cm³] | | | | | | | |
|---|---|---|---|---|---|---|---|---|---|
| Stress DC | Bias | 0 W 0 | 2 W 3.0E−03 | 5 W 7.6E−03 | 10 W 1.5E−02 | 15 W 2.3E−02 | 20 W 3.0E−02 | 25 W 3.8E−02 | 30 W 4.5E−02 |
| 3.5 kW | 2.3E+00 | — | — | — | — | — | — | — | — |
| 7 kW | 4.6E+00 | 4.4 | 5.2 | 5.3 | 5.5 | 5.5 | 5.6 | — | 5.7 |
| 10.5 kW | 6.9E+00 | — | — | 5.2 | 5.7 | 5.6 | — | — | — |
| 14 kW | 9.2E+00 | — | — | 5.1 | 5.5 | 5.5 | — | — | — |
| 17.5 kW | 1.2E+01 | — | — | — | 5.2 | 5.5 | 5.6 | — | — |
| 21 kW | 1.4E+01 | — | — | — | 5.0 | 5.2 | 5.4 | 5.5 | 5.6 |

TABLE 9

| 0/1200: 25.0 Pa | | Film deposition rate [nm/min] | | | | | | | |
|---|---|---|---|---|---|---|---|---|---|
| Stress DC | Bias | 0 W 0 | 2 W 3.0E−03 | 5 W 7.6E−03 | 10 W 1.5E−02 | 15 W 2.3E−02 | 20 W 3.0E−02 | 25 W 3.8E−02 | 30 W 4.5E−02 |
| 3.5 kW | 2.3E+00 | — | — | — | — | — | — | — | — |
| 7 kW | 4.6E+00 | 9.1 | 9.8 | 9.2 | 9.1 | 9.3 | 9.4 | — | 9.5 |
| 10.5 kW | 6.9E+00 | — | — | 16.7 | 16.9 | 16.7 | — | — | — |
| 14 kW | 9.2E+00 | — | — | 25.4 | 25.1 | 25.4 | — | — | — |

TABLE 9-continued

| 0/1200: 25.0 Pa | | Film deposition rate [nm/min] | | | | | | |
|---|---|---|---|---|---|---|---|---|
| Stress | Bias | 0 W | 2 W | 5 W | 10 W | 15 W | 20 W | 25 W | 30 W |
| DC | | 0 | 3.0E−03 | 7.6E−03 | 1.5E−02 | 2.3E−02 | 3.0E−02 | 3.8E−02 | 4.5E−02 |
| 17.5 kW | 1.2E+01 | — | — | — | 35.0 | 35.3 | 35.3 | — | — |
| 21 kW | 1.4E+01 | — | — | — | 45.2 | 45.5 | 45.7 | 45.3 | 45.5 |

TABLE 10

Film stress

| 0/1500: 37.0 Pa | | [MPa] | | | |
|---|---|---|---|---|---|
| Stress DC | Bias | 0 W 0 | 10 W 1.5E−02 | 20 W 3.0E−02 | 30 W 4.5E−02 |
| 3.5 kW | 2.3E+00 | — | — | — | — |
| 7 kW | 4.6E+00 | — | — | — | — |
| 10.5 kW | 6.9E+00 | — | — | — | — |
| 14 kW | 9.2E+00 | 622 | 1635 | 1344 | 922 |
| 17.5 kW | 1.2E+01 | — | — | — | — |
| 21 kW | 1.4E+01 | — | — | — | — |

TABLE 11

Film density

| 0/1500: 37.0 Pa | | [g/cm$^3$] | | | |
|---|---|---|---|---|---|
| Stress DC | Bias | 0 W 0 | 10 W 1.5E−02 | 20 W 3.0E−02 | 30 W 4.5E−02 |
| 3.5 kW | 2.3E+00 | — | — | — | — |
| 7 kW | 4.6E+00 | — | — | — | — |
| 10.5 kW | 6.9E+00 | — | — | — | — |
| 14 kW | 9.2E+00 | 4.5 | 5.7 | 5.7 | 5.8 |
| 17.5 kW | 1.2E+01 | — | — | — | — |
| 21 kW | 1.4E+01 | — | — | — | — |

TABLE 12

Film deposition rate

| 0/1500: 37.0 Pa | | [nm/min] | | | |
|---|---|---|---|---|---|
| Stress DC | Bias | 0 W 0 | 10 W 1.5E−02 | 20 W 3.0E−02 | 30 W 4.5E−02 |
| 3.5 kW | 2.3E+00 | — | — | — | — |
| 7 kW | 4.6E+00 | — | — | — | — |
| 10.5 kW | 6.9E+00 | — | — | — | — |
| 14 kW | 9.2E+00 | 25.3 | 25.8 | 26.0 | 26.3 |
| 17.5 kW | 1.2E+01 | — | — | — | — |
| 21 kW | 1.4E+01 | — | — | — | — |

Figure 5:
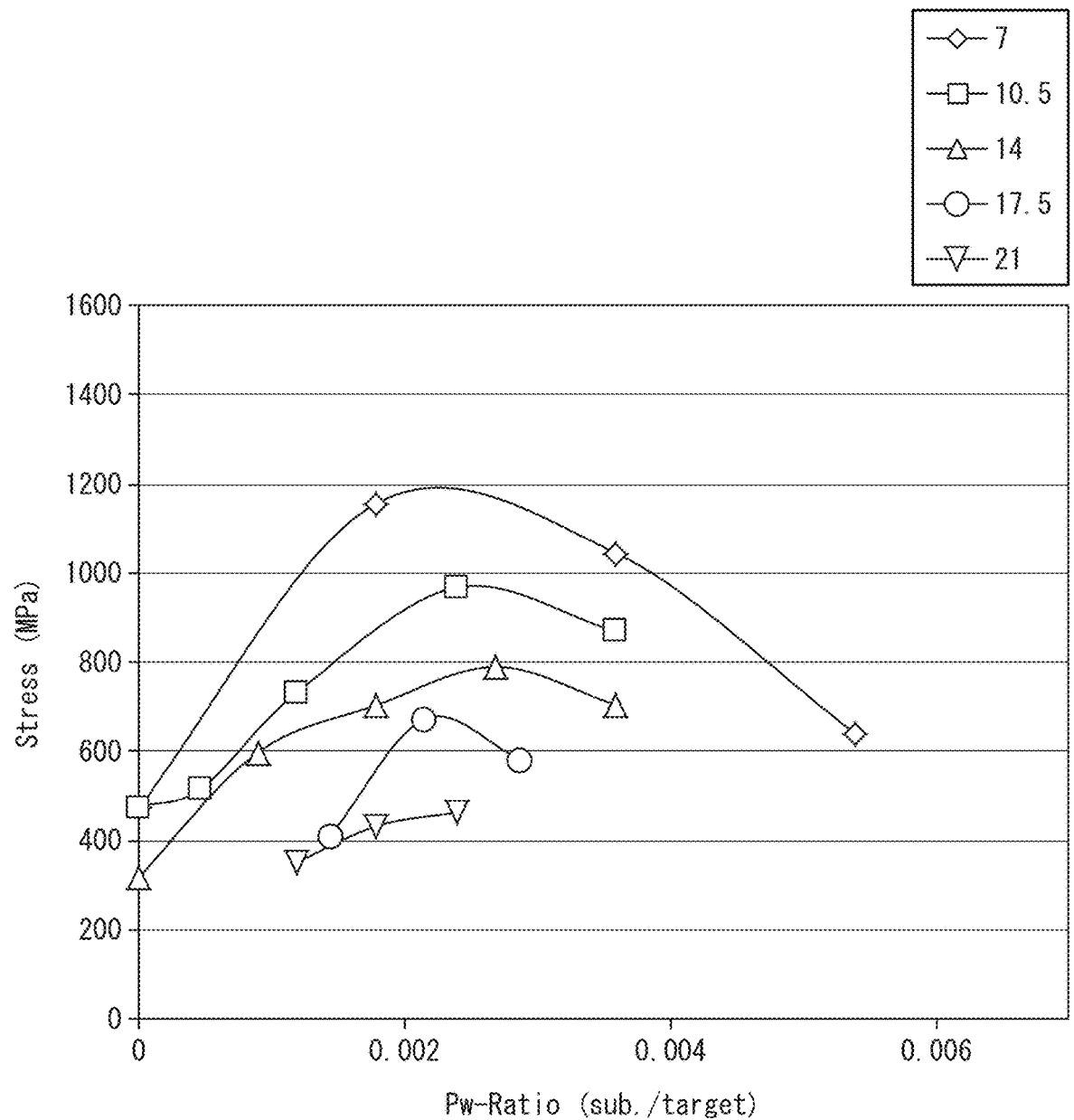
FIG. 5 is a graph showing a relationship between Pw-Ratio (sub./target) and film stress based on Table 4.
Figure 6:
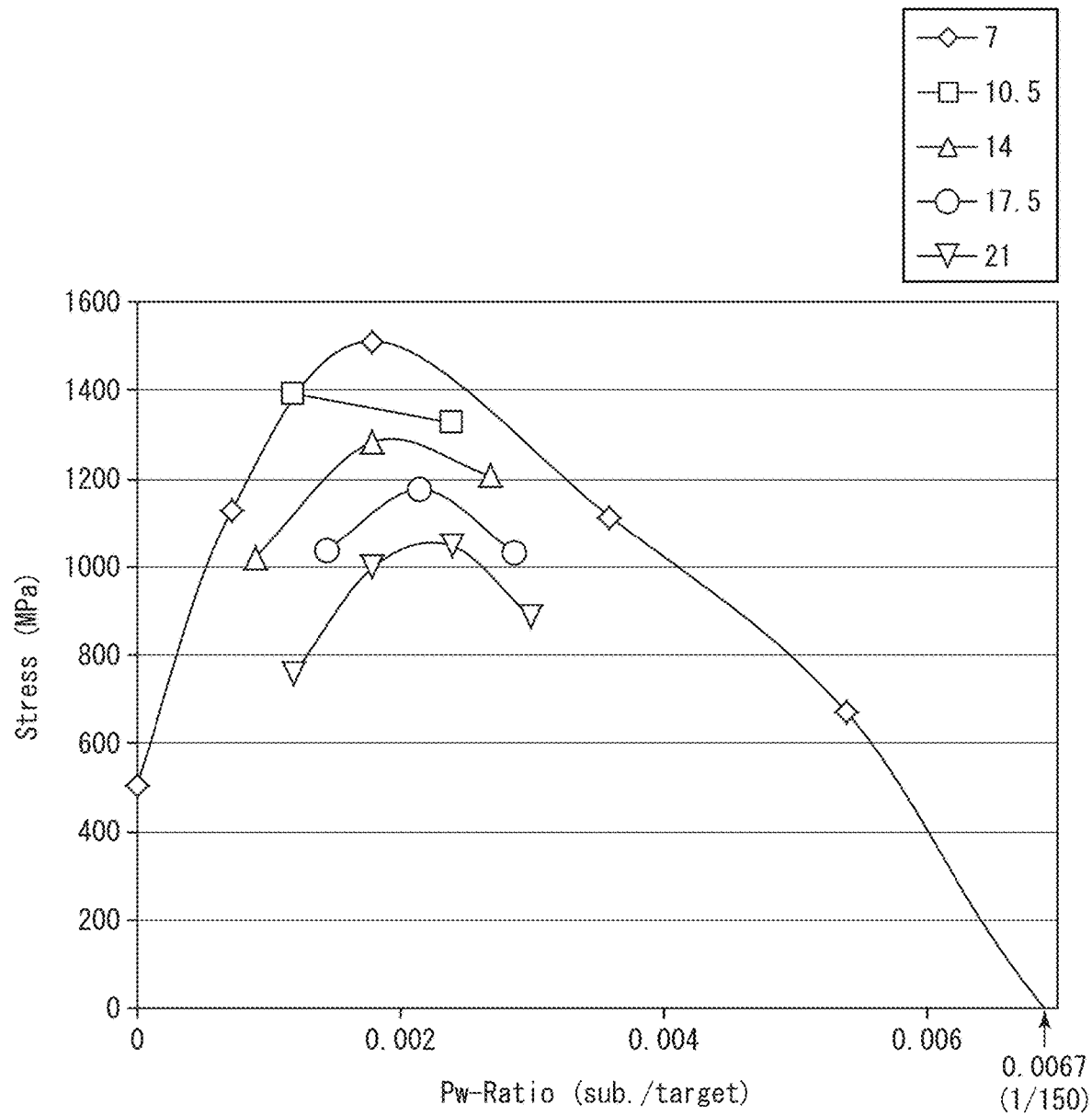
FIG. 6 is a graph showing a relationship between Pw-Ratio (sub./target) and film stress based on Table 7.

FIG. 5 is a graph showing a relationship between Pw-Ratio (sub./target) and film stress based on Table 4. FIG. 6 is a graph showing a relationship between Pw-Ratio (sub./target) and film stress based on Table 7.

From FIG. 5, it was found that, under a pressure condition (17 Pa) in Table 4, the film stress exhibited film stress on the tensile (tensile) side over the entire range of the measured Pw-Ratio (sub./target). In a case of 7 kW (marked with the symbol ◇), a maximum film stress was obtained over the entire range of the measured Pw-Ratio (sub./target).

From FIG. 6, it was found that, also under a pressure condition (25 Pa) in Table 7, the film stress exhibited film stress on the tensile (tensile) side over the entire range of the measured Pw-Ratio (sub./target). In the case of 7 kW (marked with the symbol ◇), a maximum film stress was obtained over the entire range of the measured Pw-Ratio (sub./target). Particularly, an intersection point of the curve representing the measurement result of 7 kW (marked with the symbol ◇) and the horizontal axis was 0.0067 (1/150). Therefore, from this intersection point, it was confirmed that the film stress exhibited film stress on the tensile (tensile) side when a condition that a value of the Pw-Ratio (sub./target) is small was satisfied.

Figure 7:
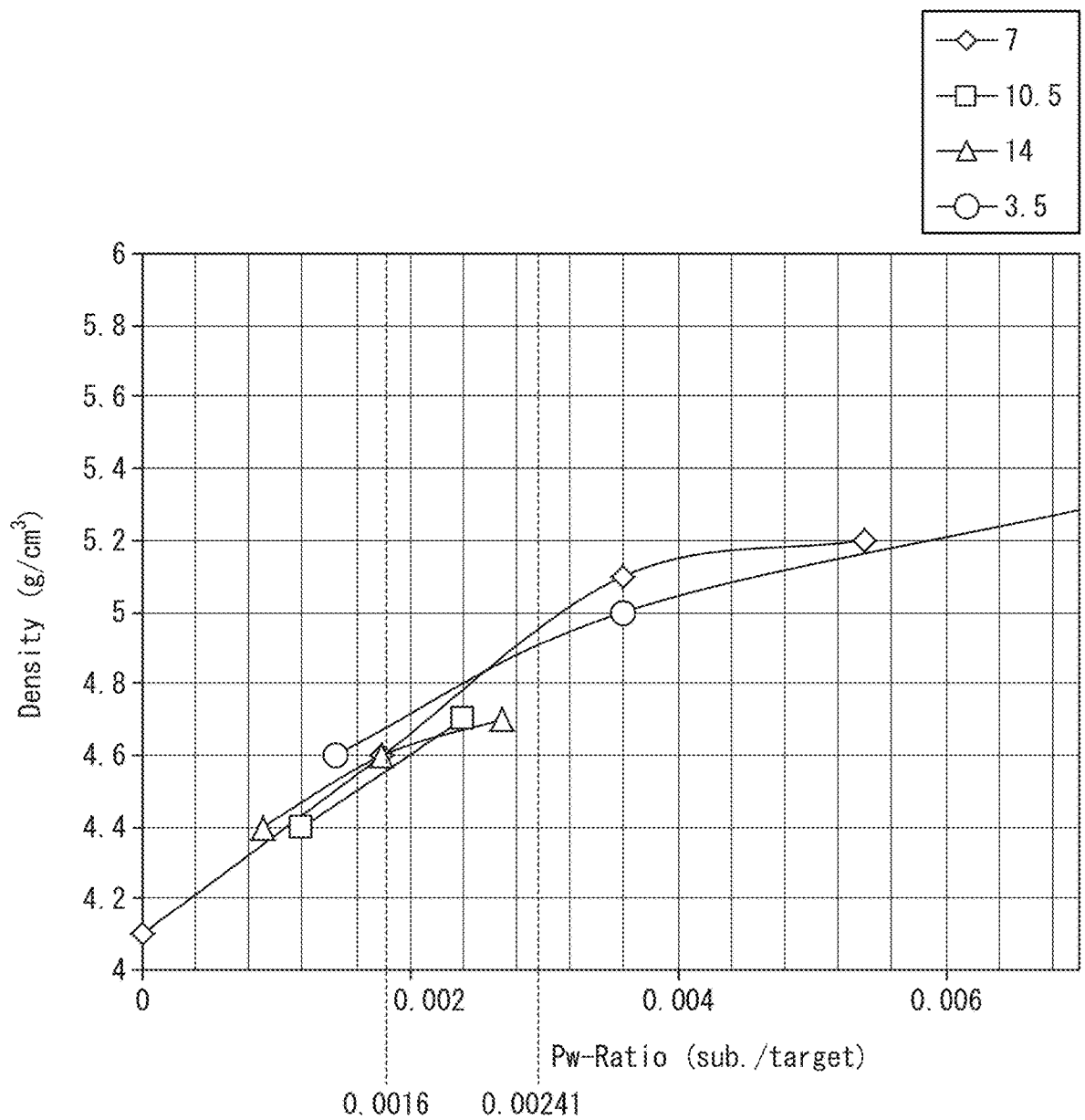
FIG. 7 is a graph showing a relationship between Pw-Ratio (sub./target) and film density based on Table 2.

FIG. 7 is a graph showing a relationship between Pw-Ratio (sub./target) and film density based on Table 2.

From FIG. 7, it was found that the film density showed an increasing tendency as the Pw-Ratio (sub./target) increased over the entire range of the measured Pw-Ratio (sub./target). When the Pw-Ratio (sub./target) was approximately 0.0016, the film density was 4.6. Also, when the Pw-Ratio (sub./target) was approximately 0.00241, the film density was 5.0.

Therefore, from the result of FIG. 7, it became clear that setting of the Pw-Ratio (sub./target) needs only to be 0.0016 or more (0.00241 or more) in order to make the film density 4.6 (5.0) or more.

Tables 13 to 15 shown below are rearranged for each of three conditions (7, 10.5, and 14 (kW)) of the DC power (having a negative potential) applied to the target 2 based on the data of Tables 1 to 12. In each table, results (film stress and film density) obtained by a condition in which the bias BS applied to the object to be processed was increased from an upper line toward a lower line are listed in order.

TABLE 13

| Ar = 0 sccm, N2 = 1200 sccm | | | | | | | | | |
|---|---|---|---|---|---|---|---|---|---|
| DC kW | Bias W | DC W/cm$^2$ | Bias W/cm$^2$ | DC/Bias | Pres Pa | Rate nm/min | Bias with respect to 10 nm/min | Stress MPa | Density g/cm$^3$ |
| 7 | 0 | 4.6E+00 | 0 | — | 25 | 9.1 | — | 507 | 4.36 |
| 7 | 2 | 4.6E+00 | 3.0E−03 | 1520 | 25 | 9.8 | 3.0E−03 | 1125 | 5.20 |
| 7 | 5 | 4.6E+00 | 7.8E−03 | 608 | 25 | 9.2 | 8.3E−03 | 1511 | 5.33 |
| 7 | 10 | 4.6E+00 | 1.5E−02 | 304 | 25 | 9.1 | 1.7E−02 | 1114 | 5.53 |
| 7 | 15 | 4.6E+00 | 2.3E−02 | 203 | 25 | 9.3 | 2.4E−02 | 672 | 5.52 |

TABLE 13-continued

Ar = 0 sccm, N2 = 1200 sccm

| DC kW | Bias W | DC W/cm² | Bias W/cm² | DC/Bias | Pres Pa | Rate nm/min | Bias with respect to 10 nm/min | Stress MPa | Density g/cm³ |
|---|---|---|---|---|---|---|---|---|---|
| 7 | 20 | 4.6E+00 | 3.0E−02 | 152 | 25 | 9.4 | 3.2E−02 | −95 | 5.60 |
| 7 | 30 | 4.6E+00 | 4.5E−02 | 101 | 25 | 9.5 | 4.8E−02 | −984 | 5.71 |
| 7 | 40 | 4.6E+00 | 6.1E−02 | 76 | 25 | 9.6 | 6.3E−02 | −2049 | 5.76 |
| 7 | 50 | 4.6E+00 | 7.6E−02 | 61 | 25 | 9.6 | 7.9E−02 | −2750 | 5.67 |

TABLE 14

Ar = 0 sccm, N2 = 1200 sccm

| DC kW | Bias W | DC W/cm² | Bias W/cm² | DC/Bias | Pres Pa | Rate nm/min | Bias with respect to 10 nm/min | Stress MPa | Density g/cm³ |
|---|---|---|---|---|---|---|---|---|---|
| 10.5 | 0 | 6.9E+00 | 0 | — | 25 | 24.3 | — | 603 | 4.50 |
| 10.5 | 5 | 6.9E+00 | 7.6E−03 | 912 | 25 | 24.5 | 3.1E−03 | 1048 | 5.28 |
| 10.5 | 10 | 6.9E+00 | 1.5E−02 | 456 | 25 | 24.6 | 6.2E−03 | 1417 | 5.69 |
| 10.5 | 15 | 6.9E+00 | 2.3E−02 | 304 | 25 | 24.7 | 9.2E−03 | 1250 | 5.84 |
| 10.5 | 15 | 6.9E+00 | 2.3E−02 | 304 | 25 | 24.6 | 9.2E−03 | 1344 | 5.85 |
| 10.5 | 20 | 6.9E+00 | 3.0E−02 | 228 | 25 | 24.7 | 1.2E−02 | 1089 | 5.87 |
| 10.5 | 25 | 6.9E+00 | 3.8E−02 | 182 | 25 | 24.8 | 1.5E−02 | 855 | 5.89 |
| 10.5 | 30 | 6.9E+00 | 4.5E−02 | 152 | 25 | 24.9 | 1.8E−02 | 668 | 5.92 |
| 10.5 | 40 | 6.9E+00 | 6.1E−02 | 114 | 25 | 25.0 | 2.4E−02 | −58 | 5.94 |
| 10.5 | 45 | 6.9E+00 | 6.8E−02 | 101 | 25 | 25.2 | 2.7E−02 | −378 | 0.00 |
| 10.5 | 50 | 6.9E+00 | 7.6E−02 | 91 | 25 | 25.2 | 3.0E−02 | −857 | 5.96 |

TABLE 15

Ar = 0 sccm, N2 = 1200 sccm

| DC kW | Bias W | DC W/cm² | Bias W/cm² | DC/Bias | Pres Pa | Rate nm/min | Bias with respect to 10 nm/min | Stress MPa | Density g/cm³ |
|---|---|---|---|---|---|---|---|---|---|
| 14 | 0 | 8.4E+00 | 0.0E+00 | — | 25 | 36.1 | — | 525 | 4.53 |
| 14 | 10 | 8.4E+00 | 1.5E−02 | 608 | 25 | 37.1 | 4.1E−03 | 1093 | 5.38 |
| 14 | 15 | 8.4E+00 | 2.3E−02 | 405 | 25 | 37.1 | 6.1E−03 | 1287 | 5.69 |
| 14 | 20 | 8.4E+00 | 3.0E−02 | 304 | 25 | 37.1 | 8.2E−03 | 1180 | 5.75 |
| 14 | 25 | 8.4E+00 | 3.8E−02 | 243 | 25 | 37.1 | 1.0E−02 | 1006 | 5.82 |
| 14 | 30 | 8.4E+00 | 4.5E−02 | 203 | 25 | 37.4 | 1.2E−02 | 844 | 5.86 |
| 14 | 40 | 8.4E+00 | 6.1E−02 | 152 | 25 | 37.5 | 1.6E−02 | 408 | 5.91 |
| 14 | 50 | 8.4E+00 | 7.6E−02 | 122 | 25 | 37.6 | 2.0E−02 | −36 | 5.93 |
| 14 | 55 | 8.4E+00 | 8.3E−02 | 111 | 25 | 37.1 | 2.2E−02 | −355 | 0.00 |
| 14 | 60 | 8.4E+00 | 9.1E−02 | 101 | 25 | 37.3 | 2.4E−02 | −632 | 0.00 |

Figure 8:
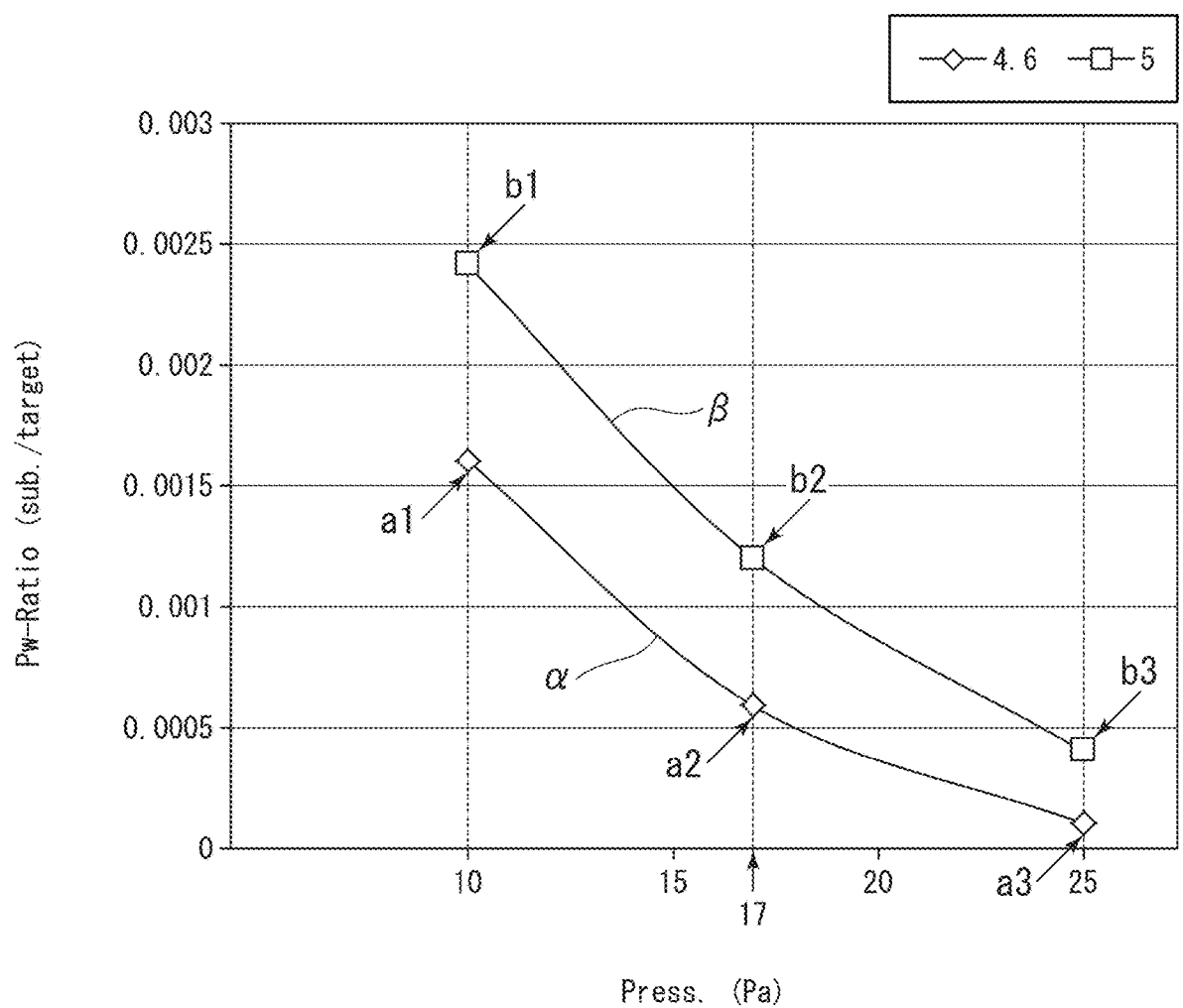
FIG. 8 is a graph (graph G1) showing a relationship between a pressure and Pw-Ratio (sub./target) at the time of forming a thin film.
Figure 9:
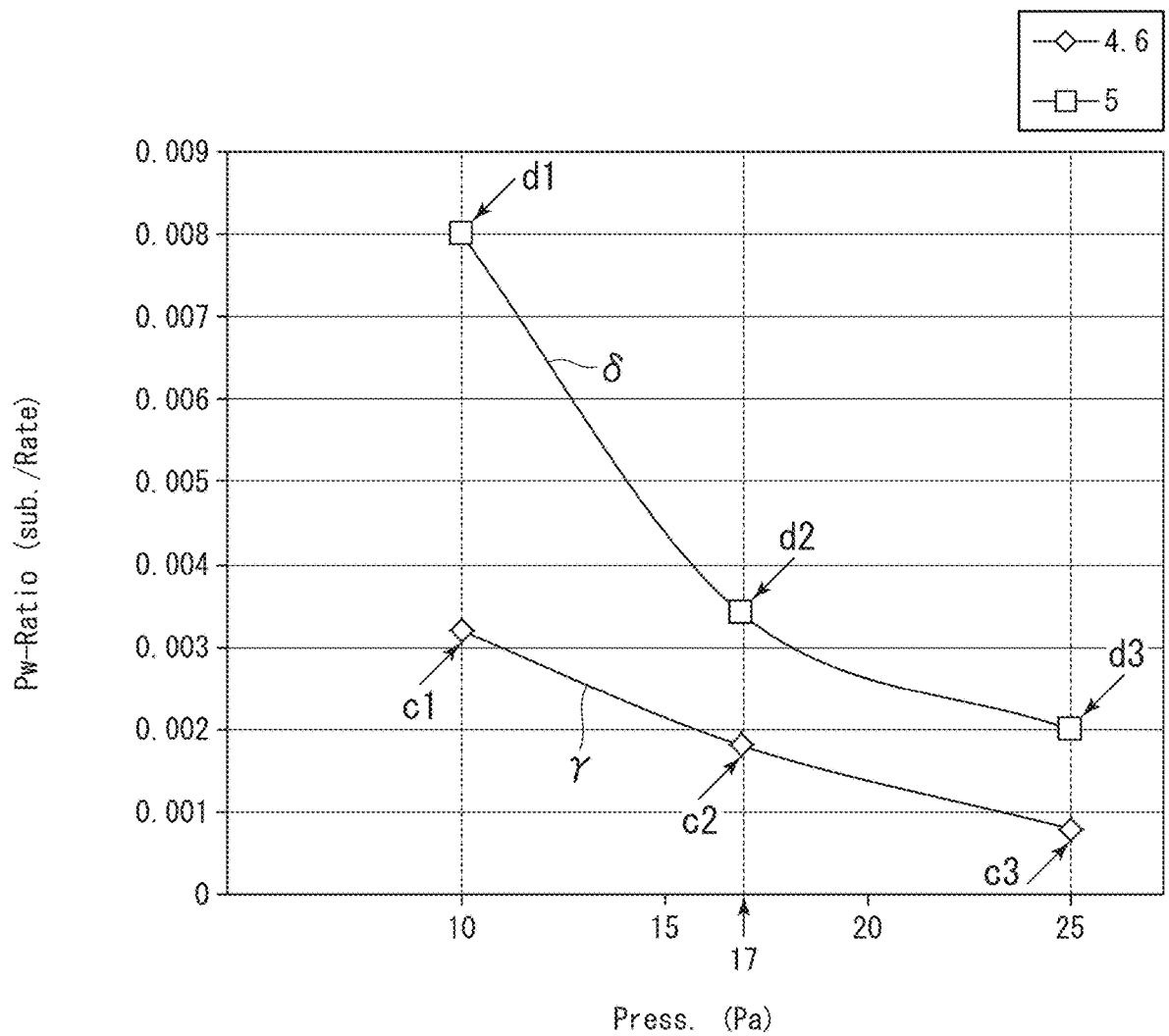
FIG. 9 is a graph (graph G2) showing a relationship between a pressure and Ratio (sub./Rate) at the time of forming a thin film.

The inventors prepared graphs of FIGS. 8 and 9 in order to find more characteristic tendencies from Tables 1 to 15 described above.

FIG. 8 is a graph showing a relationship between a pressure at the time of forming a thin film and Pw-Ratio (sub./target). FIG. 9 is a graph showing a relationship between a pressure at the time of forming a thin film and Ratio (sub./Rate).

Here, the "pressure at the time of forming a thin film" is the "pressure P of a process gas." The "Pw-Ratio (sub./target)" is the "ratio R1 (=BS/BT) which is a numerical value obtained by dividing the bias BS applied to the object to be processed by the bias BT applied to the target." The "Ratio (sub./Rate)" means the "ratio R2 that is a numerical value of the bias BS applied to the object to be processed with respect to a film deposition rate of 10 nm/min of an internal stress control film."

Very similar tendencies can be found in FIGS. 8 and 9. That is, in the graph G1 (FIG. 8) in which the horizontal axis is a pressure at the time of forming a thin film and the vertical axis is the Pw-Ratio (sub./target), it was found that film density drew a curve like a contour line. It was confirmed that there was a tendency to occupy an upper right region in graph 1 as the film density became higher.

Specifically, in the graph G1 in which the horizontal axis is the pressure P of the process gas and the vertical axis is the ratio R1 (=BS/BT) which is a numerical value obtained by dividing the bias BS applied to the object to be processed by the bias BT applied to the target, a titanium nitride film having a film density of 4.6 (g/cm³) or more can be obtained by selecting a combination of the pressure P and the ratio R1 from the graph so as to be included in an upper right region of the graph α passing through three points a1 (10.0, 0.0016), a2 (17.0, 0.00059), and a3 (25.0, 0.0001).

Furthermore, a titanium nitride film fabricated by selecting a combination of the pressure P and the ratio R1 from the graph so as to be included in an upper right region of the curve β passing through three points b1 (10.0, 0.00241), b2 (17.0, 0.0012), and b3 (25.0, 0.0004) in the graph G 1 has a film density of 5.0 (g/cm$^3$) or more.

Similarly, also in the graph G2 (FIG. 9) in which the horizontal axis is a pressure at the time of forming a thin film and the vertical axis is Ratio (sub./Rate), it was found that film density drew a curve like a contour line. It was confirmed that there was a tendency to occupy an upper right region in graph 2 as the film density became higher.

Specifically, in the graph G2 in which the horizontal axis is the pressure P of the process gas and the vertical axis is the ratio R2 (=DR/BS) which is a value obtained by dividing the film deposition rate DR of the internal stress control film by the bias BS applied to the object to be processed, a titanium nitride film having a film density of 4.6 (g/cm$^3$) or more can be obtained by selecting a combination of the pressure P and the ratio R2 from the graph so as to be included in an upper right region of a curve γ passing through three points c1 (10.0, 0.0032), c2 (17.0, 0.0018), and c3 (25.0, 0.0008).

Furthermore, a titanium nitride film fabricated by selecting a combination of the pressure P and the ratio R2 from the graph G2 so as to be included in an upper right region of the curve δ passing through three points d1 (10.0, 0.008), d2 (17.0, 0.0034), and d3 (25.0, 0.002) has a film density of 5.0 (g/cm$^3$) or more.

Results shown in FIGS. 8 and 9 provide important indices for managing a process of manufacturing a titanium nitride film having high film density and film stress on the tensile (tensile) side as film stress.

That is, if a titanium nitride film is formed to satisfy the indices of FIGS. 8 and 9, it is possible to establish a process suitable for mass production that can stably manufacture the titanium nitride film having a film density of 4.6 (g/cm$^3$) or more, or 5.0 (g/cm$^3$) or more and having film stress on the tensile (tensile) side as film stress.

Figure 10:
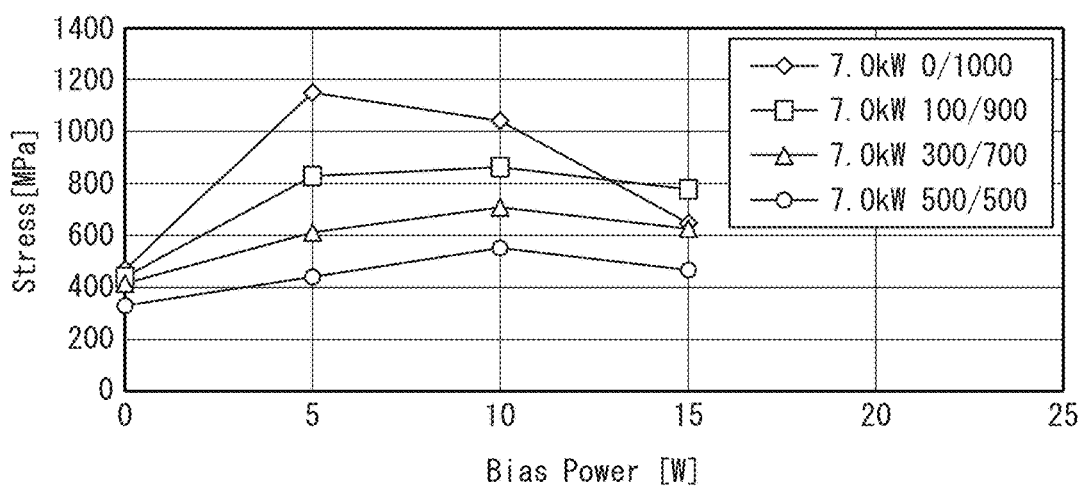
FIG. 10 is a graph showing a relationship between a bias power and film stress.
Figure 11:
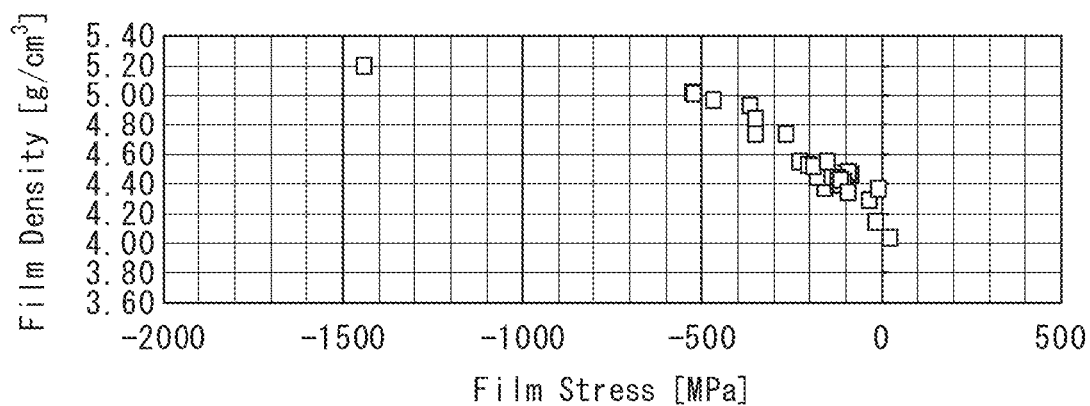
FIG. 11 is a graph showing a relationship between film stress and film density in a conventional titanium nitride film.
Figure 12A:
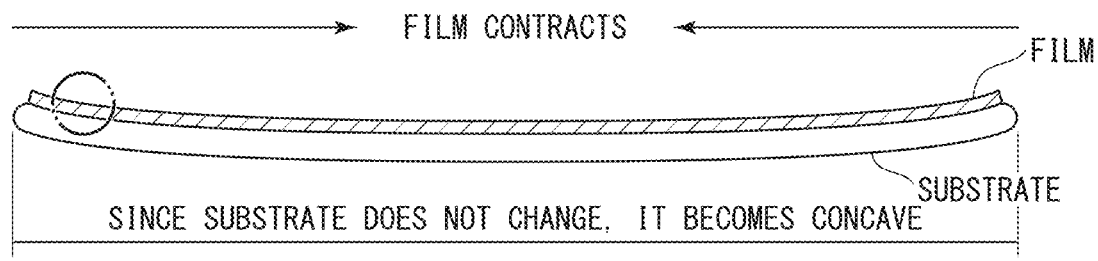
FIG. 12A is a view showing a relationship between a structure of an internal stress control film (titanium nitride film) and film stress, showing a cross section of the internal stress control film, and represents a state in which tensile stress acting so that the film (titanium nitride film) contracts with respect to a substrate (object to be processed) is generated.
Figure 12B:
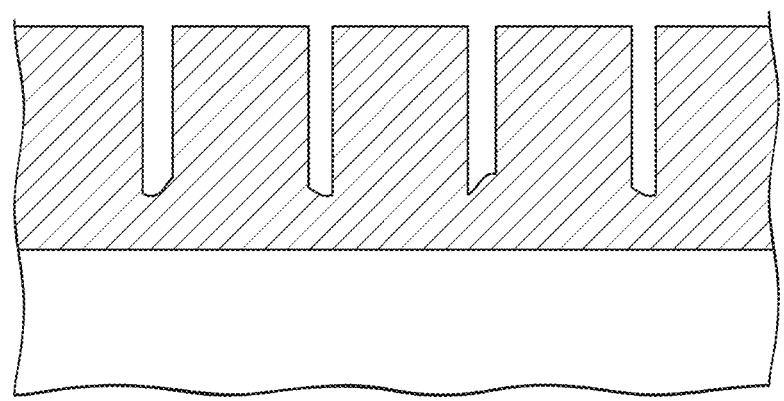
FIG. 12B is a view showing a relationship between a structure of the internal stress control film (titanium nitride film) and film stress, and is an enlarged view showing FIG. 12A.
Figure 12C:
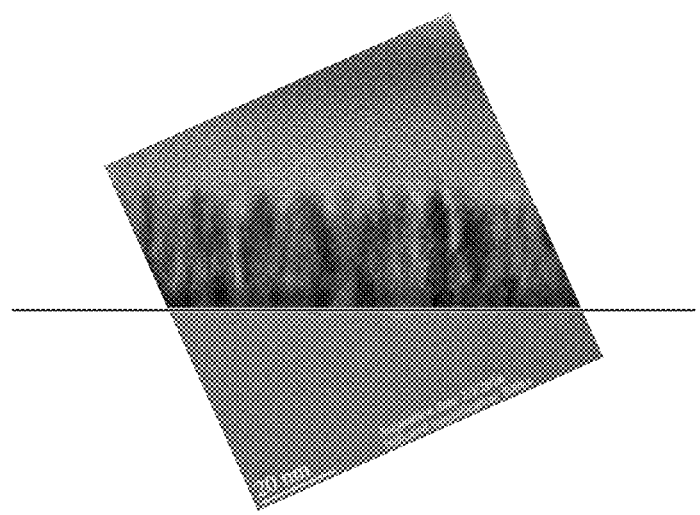
FIG. 12C is a view showing a relationship between a structure of the internal stress control film (titanium nitride film) and film stress, and is a STEM image showing a cross section of the titanium nitride film.
Figure 12D:
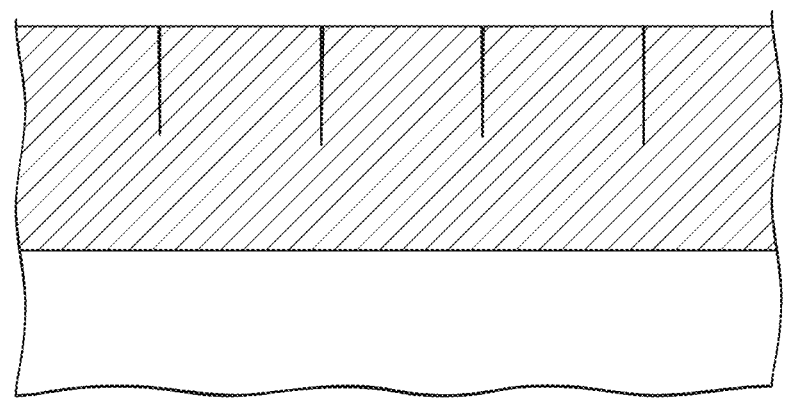
FIG. 12D is a view showing a relationship between a structure of the internal stress control film (titanium nitride film) and film stress.

FIG. 10 is a graph showing a relationship between a bias power and film stress. A case in which the nitrogen-containing gas forming the process gas is composed of argon gas and nitrogen gas was investigated. In FIG. 10, the symbol ◇ indicates a case in which the nitrogen gas was 100%, the symbol □ indicates a case in which the argon gas was 10% and the nitrogen gas was 90%, the symbol Δ indicates a case in which the argon gas was 30% and the nitrogen gas was 70%, and the symbol ○ indicates a case in which the argon gas was 50% and the nitrogen gas was 50%.

From FIG. 10, the following points became clear.

(C1) When the bias BS was weakly applied (5 W to 10 W), film stress became tensile (tensile) and showed an increasing tendency as compared with the case in which the bias BS was not applied (0 W). This increasing tendency did not depend on a ratio of the argon gas and nitrogen gas as long as a proportion occupied by the nitrogen gas in the nitrogen-containing gas was 50% or more.

(C2) When compared at a same value of the bias BS (for example, 5 (W)), greater tensile (tensile) film stress was observed as a proportion occupied by the nitrogen gas in the nitrogen-containing gas increased.

(C3) When the bias BS was 15 W, the film stress turned to a decreasing tendency as compared with that at 10 W. This increasing tendency did not depend on the ratio of the argon gas and the nitrogen gas as long as a proportion occupied by the nitrogen gas in the nitrogen-containing gas was 50% or more.

From the results described above, it was confirmed that, when the nitrogen-containing gas forming the process gas is composed of the argon gas and the nitrogen gas and a flow rate ratio occupied by the nitrogen gas in the nitrogen-containing gas was 50(%) or more, it became clear that the internal stress control film having film stress on the tensile (tensile) side could be stably obtained.

While a method of manufacturing an internal stress control film according to the invention has been described, it should be understood that it is exemplary of the invention and should not be considered as limiting. Additions, omissions, substitutions, and other changes can be made without departing from the scope of the invention. Accordingly, the invention should not be regarded as limited by the foregoing description, but is limited only by the claims.

In the above-described embodiment, a case in which the internal stress control film is titanium nitride has been described in detail, but the invention is not limited to titanium nitride (TiN), and can be widely applied to materials for forming a film using a nitrogen-containing gas. That is, as the internal stress control film to which the invention is applied, aluminum nitride (AlN), silicon nitride (SiN), or the like can be exemplified in addition to titanium nitride (TiN).

Furthermore, although the substrate W made of a silicon wafer was described as an example of the object to be processed in the embodiment described above, for example, the invention can also be applied to a case in which it is formed on a surface of an interlayer insulating film or an outermost surface of a multilayer structure. In other words, the internal stress control film formed by the manufacturing method of the invention has an advantage in that it can be flexibly applied independently of an underlying material or a structure on which the internal stress control film is provided.

Furthermore, in the embodiment described above, the substrate W serving as the object to be processed was not heat-treated at the time of forming the internal stress control film, but the invention is not limited thereto. Depending on a material and thickness of the internal stress control film to be formed and on underlying conditions (substrate W or film material, film structure, or the like) of the internal stress control film, the object to be processed may be controlled to an appropriate and desired temperature. For example, by disposing the temperature control device H controlling a temperature of the object to be processed inside the stage 4 on which the object to be processed (substrate W) is placed in FIG. 1, the temperature of the object to be processed can be controlled.

Industrial Applicability

The invention is widely applicable to a method of manufacturing an internal stress control film. Such an internal stress control film can be used, for example, not only for a hard mask application in a process of manufacturing a semiconductor device but also for various other device applications.

DESCRIPTION OF REFERENCE NUMERALS

E1 Sputtering power supply
E2 Bias power supply
SM Sputtering apparatus
W Substrate (object to be processed)
1a Vacuum processing chamber 2 Target
4 Stage
51 Mass flow controller

What is claimed is:

1. A method of forming an internal stress control film on one surface of an object to be processed by a sputtering method, comprising:
   selecting a pressure of a process gas at the time of forming the internal stress control film from a pressure region higher than a threshold value of 5 (Pa) wherein the internal stress control film is made of titanium nitride;
   using a target made of titanium, and using a nitrogen-containing gas as the process gas; and
   in a graph G1 in which a horizontal axis is a pressure P of the process gas and a vertical axis is a ratio R1 (=BS/BT) which is a numerical value obtained by dividing a bias BS applied to the object to be processed by a bias BT applied to the target, selecting a combination of the pressure P and the ratio R1 from the graph so as to be included in an upper right region of a curve α passing through three points a1 (10.0, 0.0016), a2 (17.0, 0.00059), and a3 (25.0, 0.0001).

2. The method of forming an internal stress control film according to claim 1, wherein a combination of the pressure P and the ratio R1 is selected from the graph G1 so as to be included in an upper right region of a curve β passing through three points b1 (10.0, 0.00241), b2 (17.0, 0.0012), and b3 (25.0, 0.0004).

3. The method of forming an internal stress control film according to claim 1, wherein
   a nitrogen-containing gas forming the process gas is composed of argon gas and nitrogen gas, and
   a flow rate ratio occupied by the nitrogen gas in the nitrogen-containing gas is 50 (%) or more.

4. The method of forming an internal stress control film according to claim 1, wherein
   a nitrogen-containing gas forming the process gas is composed of argon gas and nitrogen gas, and
   a flow rate ratio occupied by the nitrogen gas in the nitrogen-containing gas is 70 (%) or more.

5. A method of forming an internal stress control film on one surface of an object to be processed by a sputtering method, comprising:
   selecting a pressure of a process gas at the time of forming the internal stress control film from a pressure region higher than a threshold value of 5 (Pa) wherein the internal stress control film is made of titanium nitride;
   using a target made of titanium, and using a nitrogen-containing gas as the process gas; and
   in a graph G2 in which a horizontal axis is a pressure P of the process gas and a vertical axis is a ratio R2 which is a numerical value of a bias BS applied to the object to be processed with respect to a film deposition rate of 10 nm/min of the internal stress control film, selecting a combination of the pressure P and the ratio R2 from the graph so as to be included in an upper right region of a curve γ passing through three points c1 (10.0, 0.0032), c2 (17.0, 0.0018), and c3 (25.0, 0.0008).

6. The method of forming an internal stress control film according to claim 5, wherein a combination of the pressure P and the ratio R2 is selected from the graph G2 so as to be included in an upper right region of a curve δ passing through three points d1 (10.0, 0.008), d2 (17.0, 0.0034), and d3 (25.0, 0.002).

7. The method of forming an internal stress control film according to claim 5, wherein
   a nitrogen-containing gas forming the process gas is composed of argon gas and nitrogen gas, and
   a flow rate ratio occupied by the nitrogen gas in the nitrogen-containing gas is 50 (%) or more.

8. The method of forming an internal stress control film according to claim 5, wherein
   a nitrogen-containing gas forming the process gas is composed of argon gas and nitrogen gas, and
   a flow rate ratio occupied by the nitrogen gas in the nitrogen-containing gas is 70 (%) or more.

* * * * *